(12) United States Patent
Lin (10) Patent No.: US 11,579,176 B2
(45) Date of Patent: Feb. 14, 2023

(54) SENSING SYSTEM AND SENSING SIGNAL MEASURING METHOD THEREOF

(71) Applicant: Industrial Technology Research Institute, Hsinchu (TW)

(72) Inventor: Hsuan-Yu Lin, Changhua County (TW)

(73) Assignee: Industrial Technology Research Institute, Hsinchu (TW)

( * ) Notice: Subject to any disclaimer, the term of this patent is extended or adjusted under 35 U.S.C. 154(b) by 437 days.

(21) Appl. No.: 16/729,485

(22) Filed: Dec. 30, 2019

(65) Prior Publication Data

US 2021/0199701 A1  Jul. 1, 2021

(51) Int. Cl.
*G01R 23/167* (2006.01)

(52) U.S. Cl.
CPC .................. *G01R 23/167* (2013.01)

(58) Field of Classification Search
CPC ..................................... G01R 23/167
USPC ........................................................ 702/190
See application file for complete search history.

(56) References Cited

U.S. PATENT DOCUMENTS

| | | | | |
|---|---|---|---|---|
| 7,295,490 B1 * | 11/2007 | Chiu | ..................... | G01V 1/005 367/41 |
| 7,878,064 B2 | 2/2011 | Abbott et al. | | |
| 2010/0157733 A1 * | 6/2010 | Daly | ......................... | G01V 1/37 367/41 |
| 2015/0331123 A1 * | 11/2015 | Guigné | ..................... | G01V 1/34 702/16 |
| 2016/0018544 A1 * | 1/2016 | Eick | ........................ | G01V 1/364 367/21 |
| 2016/0191163 A1 | 6/2016 | Preston et al. | | |

FOREIGN PATENT DOCUMENTS

| | | |
|---|---|---|
| CN | 203929975 | 11/2014 |
| CN | 103323807 | 9/2015 |
| CN | 104833854 | 11/2018 |
| CN | 109342906 | 2/2019 |
| CN | 109459614 | 3/2019 |

(Continued)

OTHER PUBLICATIONS

"Notice of Allowance of Taiwan Counterpart Application," dated Jul. 29, 2020, p. 1-p. 4.

*Primary Examiner* — Ricky Go
(74) *Attorney, Agent, or Firm* — JCIPRNET (57) ABSTRACT

A sensing system and a sensing signal measuring method thereof are provided. The sensing system includes a signal source, a connecting device, a frequency sweep circuit, and a controller. In the method, the signal source is activated to generate a specific signal. The controller controls the frequency sweep circuit to switch a frequency band of a frequency sweep signal to a first frequency band corresponding to each of a plurality of types of multi-point sensors. The controller receives a sensor signal of each multi-point sensor through the connecting device, where the sensor signal is a variation of a measurement signal output by each multi-point sensor in response to the specific signal and the frequency sweep signal. The controller executes an adaptive algorithm on the sensor signal to construct a correspondence between an eigenvalue of each multi-point sensor and a location of the first frequency band, and records the correspondence.

20 Claims, 5 Drawing Sheets

(56) References Cited

FOREIGN PATENT DOCUMENTS

| | | |
|---|---|---|
| CN | 106325635 | 6/2019 |
| CN | 109921796 | 6/2019 |
| EP | 3249807 | 11/2017 |
| TW | 550387 | 9/2003 |
| TW | I463177 | 12/2014 |
| TW | 201724741 | 7/2017 |

* cited by examiner

SENSING SYSTEM AND SENSING SIGNAL MEASURING METHOD THEREOF

TECHNICAL FIELD

The technical field relates to a sensing system and a sensing signal measuring method thereof.

BACKGROUND

Multi-point sensors or array sensors have been widely used in various fields, such as touch control, electronic skin, pressure sensing, electromagnetic field sensing, and distance sensing. For instance, Electrick is to connect electrodes around objects on which a conductive spray is sprayed, and a touch location is determined according to current shunting and phase delay principles. A radio frequency (RF)-based gesture input device measures a gesture according to time domain reflectometry (TDR).

In a measuring system using the foregoing multi-point sensors, each sensor may be functionally equivalent to a time-varying transfer function, and a number of characteristics with a resonance frequency in this transfer function may be excited by specific signals or signals of specific frequencies, such as white noise, square waves, and impulses. Due to different natures of measurement signals (such as electromagnetic waves, ultrasonic waves, light waves, and mechanical waves), the various measurement signals have different wave speeds, and are adapted to different measurement applications, and their response frequencies are easily subject to a manufacturing process or the environment where the sensors are used. Therefore, how to reduce the variation range of the various sensors is one of the important issues to be solved at present.

SUMMARY

The sensing signal measuring method according to the embodiment of the disclosure is applicable to a sensing system including a signal source, a connecting device, a frequency sweep circuit and a controller. The method includes following steps: activating the signal source to generate a specific signal; controlling, by the controller, the frequency sweep circuit to switch a frequency band of a frequency sweep signal to at least one first frequency band corresponding to each of a plurality of types of multi-point sensors; receiving, through the connecting device by the controller, a sensor signal of each multi-point sensor, where the sensor signal is a variation of a measurement signal output by each of the plurality of types of multi-point sensors in response to the specific signal and the frequency sweep signal, and the measurement signal is one of an electromagnetic wave signal and a mechanical wave signal; and executing, by the controller, an adaptive algorithm on the sensor signal to construct a correspondence between an eigenvalue of each of the plurality of types of multi-point sensors and a location of the at least one first frequency band, and recording the correspondence in a database.

The sensing system according to the embodiment of the disclosure includes a signal source, a connecting device, a frequency sweep circuit, and a controller. The connecting device is configured to be coupled to a plurality of types of multi-point sensors. The signal source is configured to generate a specific signal. The frequency sweep circuit is configured to generate a frequency sweep signal. The controller is coupled to the connecting device and the frequency sweep circuit, controls the frequency sweep circuit to switch a frequency band of the frequency sweep signal to at least one first frequency band corresponding to each of the plurality of types of multi-point sensors, and receives a sensor signal of each of the plurality of types of multi-point sensors through the connecting device. The sensor signal is a variation of the frequency sweep signal and a measurement signal output by each of the plurality of types of multi-point sensors in response to the specific signal, and the measurement signal is one of an electromagnetic wave signal and a mechanical wave signal. The controller executes an adaptive algorithm on the sensor signal to construct a correspondence between an eigenvalue of each of the plurality of types of multi-point sensors and a location of the at least one first frequency band, and records the correspondence in a database.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

An embodiment of the disclosure provides a measuring system capable of generating a signal and having a frequency shift circuit. In an initialized frequency sweep process, technologies such as control of frequency shift, operation of an adaptive algorithm and calibration of a specific physical quantity are cooperated to establish a database of relative relationships between physical quantities and measurement signals. In this way, during actual measurement, a frequency shift range may be adaptively adjusted for physical quantities to be measured, so as to reduce the impact range of problems such as a process and an environment and improve the accuracy of the measured physical quantities.

Figure 1:
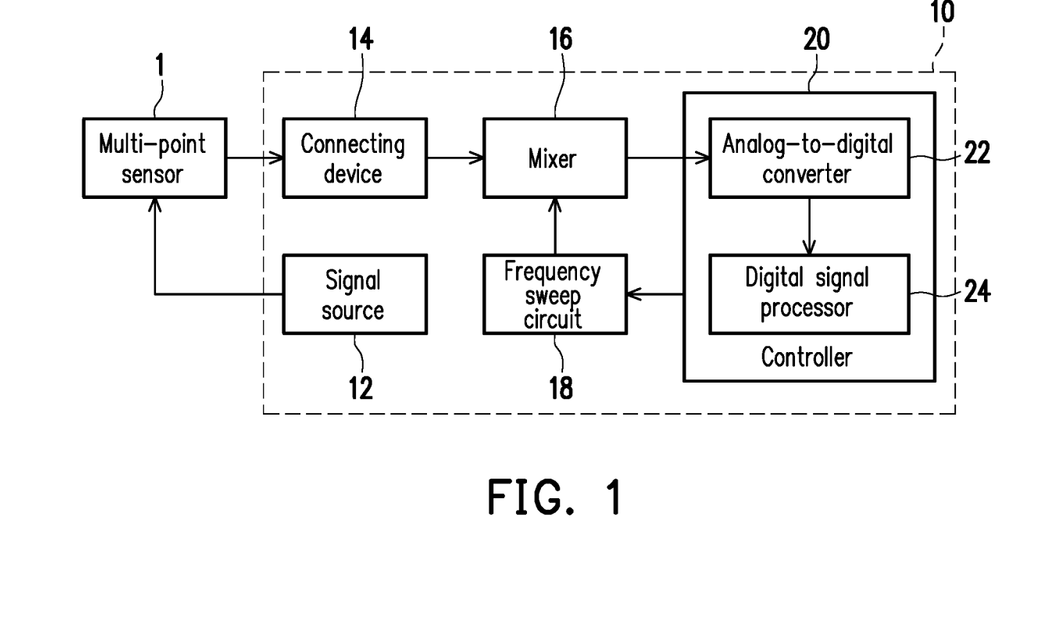
FIG. 1 is a block diagram of a sensing system according to one embodiment of the disclosure.

FIG. 1 is a block diagram of a sensing system according to one embodiment of the disclosure. With reference to FIG. 1, a sensing system 10 may be applied to sensing such as touch, hardness, pressure and distance, virtual reality (VR)/augmented reality (AR)/mixed reality (MR), or mechanical arm sensing, biological signal detection and other fields. The sensing system 10 includes a signal source 12, a connecting device 14, a mixer 16, a frequency sweep circuit 18, and a controller 20. The functions are described below.

The signal source 12 is, for instance, a signal generator that may generate a specific signal or a signal of a specific frequency, such as white noise, square waves, and impulses.

The specific signal is transmitted to a plurality of types of multi-point sensors 1, so that the different types of multi-point sensors 1 may generate measurement signals in response to a frequency of the specific signal.

The connecting device 14 is, for instance, coupled to the plurality of types of multi-point sensors 1 through a cable or in a wireless manner, so as to receive measured data output by each of the plurality of types of multi-point sensors 1. The connection of the connecting device 14 through the cable may be achieved by a universal serial bus (USB), RS232, a universal asynchronous receiver/transmitter (UART), an Inter-Integrated Circuit (I2C), a serial peripheral interface (SPI), a display port, a thunderbolt, or a local area network (LAN) interface, which should however not be construed as a limitation in the disclosure. As to the wireless connection, the connecting device 14 may support communication protocols, such as wireless fidelity (Wi-Fi), RFID, Bluetooth, infrared, near-field communication (NFC), device-to-device (D2D), and so on, which should however not be construed as a limitation in the disclosure. In addition, each multi-point sensor 1 is a sensor that may support multi-feature-point sensing, such as a touch sensor that may detect a location of a touch point on a touch panel, or a sensor that may detect physical quantities such as a temperature, a pressure and a gravity, and there is no limitation here.

The frequency sweep circuit 18 may generate, for instance, a frequency sweep signal for a given frequency band to measure a characteristic (such as an impedance characteristic or a transmission characteristic) of a circuit to be measured, and may be configured to adjust and calibrate the circuit to be measured. In the present embodiment, the frequency sweep circuit 18 may be controlled by the controller 20 and switch the frequency band of the generated frequency sweep signal accordingly.

The mixer 16 is configured to generate a new signal with a frequency obtained by performing frequency subtraction on two signals applied thereto. In the present embodiment, the mixer 16 is configured to calculate the variations of the frequency sweep signal and the measurement signals output by the multi-point sensors 1 and output a calculation result to the controller 20. In other embodiments, the mixer 16 may also be built in the controller 20, or the controller 20 may execute software to implement its functions, and implementation manners are not limited.

The controller 20 is coupled to the frequency sweep circuit 18 and the mixer 16, and is, for instance, a central processing unit (CPU), a microcontroller unit (MCU), a microprocessor, a programmable controller, an application specific integrated circuit (ASIC), a programmable logic controller (PLC) or other similar devices or a combination of these devices, so as to load and execute computer programs to perform a sensing signal measuring method according to the embodiment of the disclosure. In the present embodiment, the controller 20 includes an analog-to-digital converter (ADC) 22 configured to capture and convert sensor signals, and a digital signal processor (DSP) 24 configured to process the sensor signals converted into digital signals, and it is not limited thereto. In other embodiments, the ADC 22 may also be independently arranged outside the controller 20, and the controller 20 may directly process the sensor signals without the DSP 24.

Figure 2:
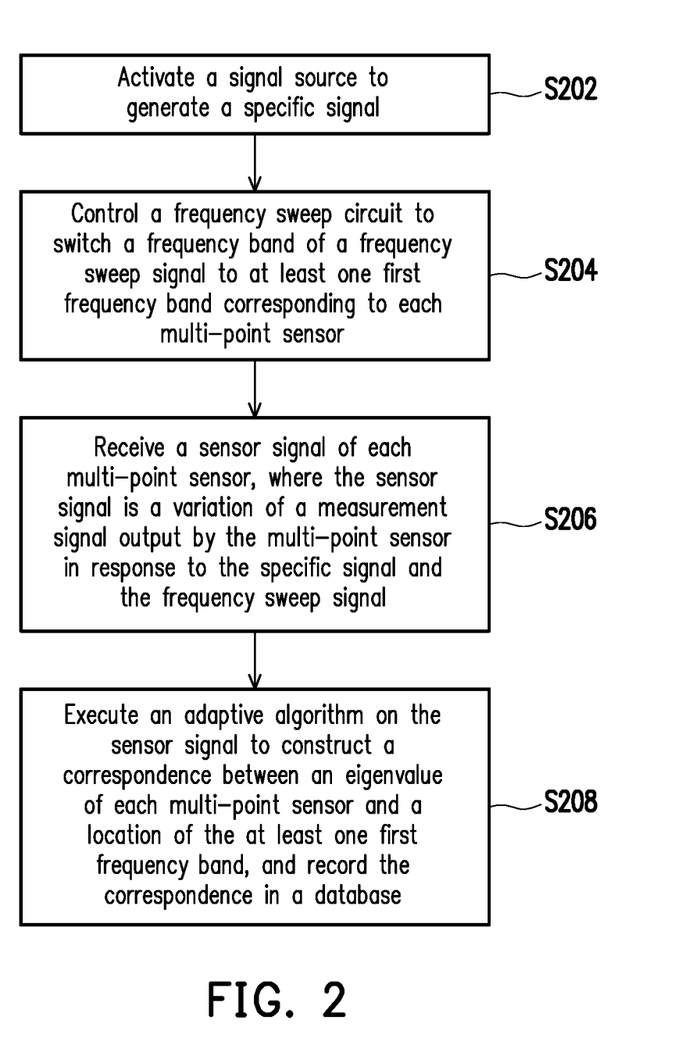
FIG. 2 is a flow diagram of a sensing signal measuring method illustrated according to one embodiment of the disclosure.

FIG. 2 is a flow diagram of a sensing signal measuring method illustrated according to one embodiment of the disclosure. Referring to FIG. 1 and FIG. 2 at the same time, the method of the present embodiment is applicable to the foregoing sensing system 10. Steps of the sensing signal measuring method of the present embodiment are described below with reference to all the elements of the sensing system 10.

In step 202, the signal source 12 is activated to generate a specific signal. In one embodiment, the signal source 12 is, for instance, activated by a user or synchronously activated when the sensing system 10 is powered on. After being activated, the signal source 12 regularly generates the specific signal or a specific signal having a specific frequency, such as white noise, square waves and impulses. A frequency range of the specific signal may cover, for instance, frequency response ranges of the multi-point sensors 1. That is, the various multi-point sensors 1 may output measurement signals in response to this specific signal. In one embodiment, the signal source 12 may also be coupled to the controller 20, and is controlled by the controller 20 to generate the specific signal, and it is not limited here.

In step S204, the controller 20 controls the frequency sweep circuit 18 to switch a frequency band of a frequency sweep signal to at least one first frequency band corresponding to each multi-point sensor 1. The controller 20 may determine, for instance, the frequency band of the frequency sweep signal according to a frequency range of the measurement signal output by each multi-point sensor 1, so that the frequency band of the switched frequency sweep signal may be close to the frequency band of the measurement signal output by the sensor. In one embodiment, since a frequency range applicable to the ADC 22 configured to capture the sensor signals in the controller 20 is limited (such as 200 kHz to 1 MHz), the controller 20 may control, for instance, the frequency sweep circuit 18 to gradually switch the frequency band of the frequency sweep signal, and a frequency range of a variation between the frequency sweep signal and the measurement signal may fall within the frequency range of the ADC 22.

For instance, in correspondence to a low-frequency mechanical wave signal, the frequency band of the frequency sweep signal may be switched to a relatively wide single frequency band with a relatively low frequency. In correspondence to a high-frequency electromagnetic wave signal, the frequency band of the frequency sweep signal may be switched to a plurality of relatively narrow frequency bands with relatively high frequencies. By switching the frequency band of the frequency sweep signal to be close to the frequency band of the measurement signal of the multi-point sensor, and considering the variation between the signals as a sensor signal, the measurement signals output by the plurality of different types of multi-point sensors may be still processed even if the frequency range of the ADC is limited.

In step S206, the controller 20 receives a sensor signal of each multi-point sensor 1 through the connecting device 14. The multi-point sensor 1 may output, for instance, the measurement signal to the mixer 16 in response to the specific signal transmitted by the signal source 12, and the measurement signal is one of the electromagnetic wave signal and the mechanical wave signal. On the other hand, the frequency sweep circuit 18 may output the switched frequency sweep signal to the mixer 16. The mixer 16 may calculate the variation between the measurement signal and the frequency sweep signal, and output a calculation result to the controller 20. For instance, if the frequency of the measurement signal output by the multi-point sensor 1 is 1 MHz, the frequency of the frequency sweep signal output by the frequency sweep circuit 18 may be switched to 0.9 MHz, and after the mixer 16 calculates the variation of the two signals, the two signals will be combined into a signal of 0.1 MHz that is input into the controller 20.

In step S208, the controller 20 executes an adaptive algorithm on the sensor signal to construct a correspondence between an eigenvalue of each multi-point sensor 1 and a location of the first frequency band, and records this correspondence into a database. In the present embodiment, the controller 20 uses, for instance, the DSP 24 to execute the adaptive algorithm, but it is not limited thereto.

For the adaptive algorithm, the controller 20 uses, for instance, an equivalent filter corresponding to each multi-point sensor 1 to calculate the sensor signal, so as to solve the eigenvalue of the equivalent filter of each multi-point sensor 1, and constructs the correspondence by the solved eigenvalue and the corresponding location of the eigenvalue in the first frequency band. The adaptive algorithm includes but is not limited to a least mean square (LMS) algorithm, a sign-data least mean square (SDLMS) algorithm, a sign-sign least mean square (SSLMS) algorithm, a normalized least mean square (NLMS) algorithm, a delayed least mean square (DLMS) algorithm, any other variations of LMS algorithms, a recursive least square (RLS) algorithm, a Levinson-durbin recursion algorithm, a linear prediction coding algorithm, and the like.

Figure 3:
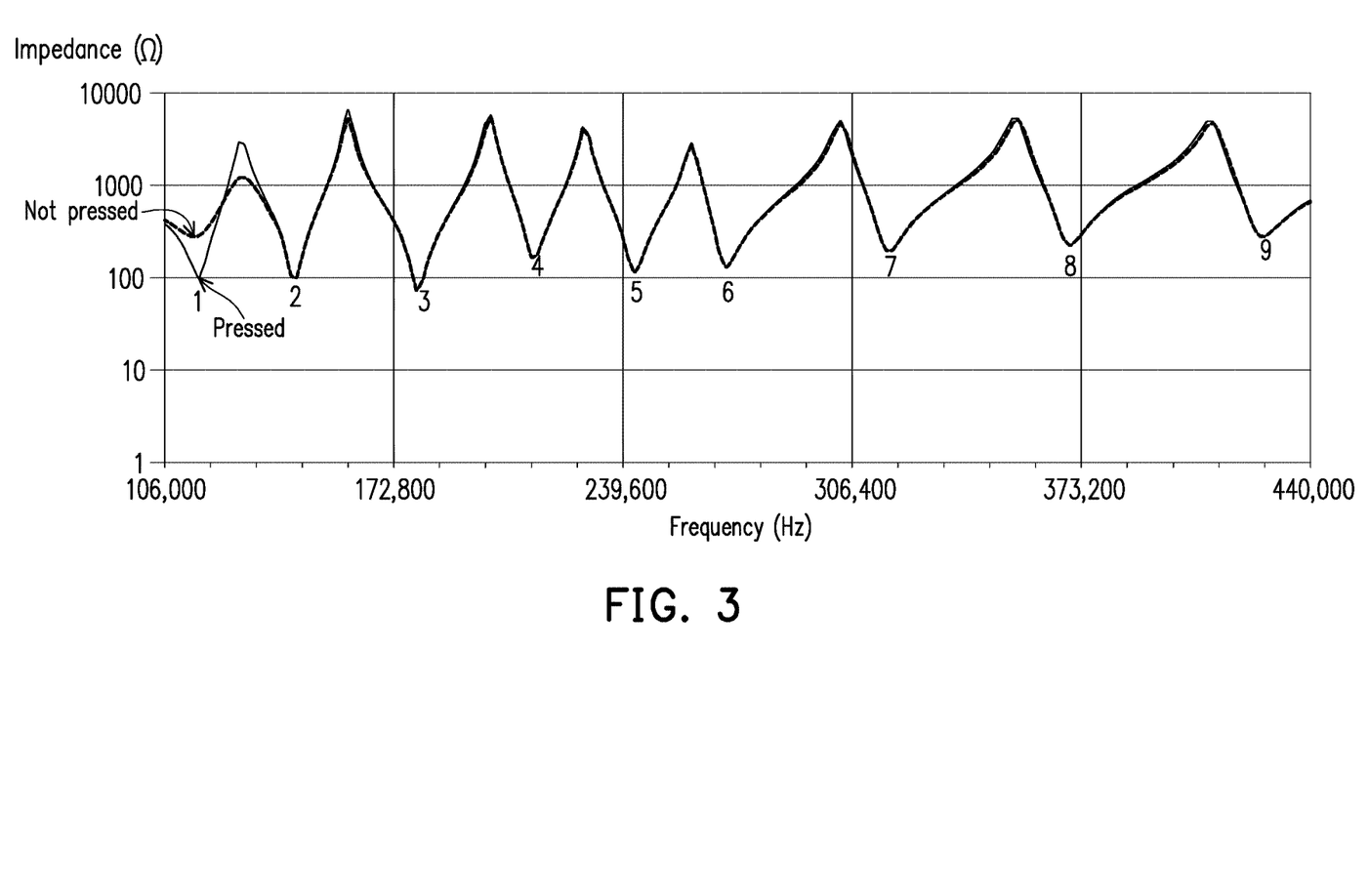
FIG. 3 is a frequency response of a sensing signal illustrated according to one embodiment of the disclosure.

For instance, FIG. 3 is a frequency response of a sensing signal illustrated according to one embodiment of the disclosure. Referring to FIG. 3, the present embodiment illustrates frequency response waveforms of sensing signals output when multi-point pressure sensors are pressed and not pressed. The numbers 1 to 9 (serving as the eigenvalues) respectively represent different pressing locations. By constructing the correspondence by the above eigenvalues and their corresponding locations in the frequency response, in actual sensing, actual pressure sensing values may be obtained by comparing the measurement signals with the correspondence.

By the above method, the sensing system 10 of the embodiment of the disclosure may obtain the sensor signals in satisfactory frequency ranges to calculate the eigenvalues via adjusting the frequency band of the frequency sweep signal output by the frequency sweep circuit 18 in response to the frequency ranges of the different types of multi-point sensors 1.

The sensing signal measuring method of the above embodiment is, for instance, executed by a manufacturer of the sensing system to pre-construct and record the correspondence between the eigenvalues and measurement signal locations for the various multi-point sensors (physical quantities) before delivery. However, even though the data construction for the various multi-point sensors has been performed before delivery, the multi-point sensors may still need to be re-calibrated on the basis of different usage situations after the delivery. For instance, for a smart garment equipped with a pressure sensor, when a user wears it for the first time, a pre-pressure applied by the body of the user to the smart garment needs to be sensed, so as to calibrate (reset) a pressure sensing value. Later, when the pressure sensor undergoes an external pressure, a real pressure value may be reflected. In this regard, the disclosure provides an embodiment to calibrate and update the constructed data.

Figure 4:
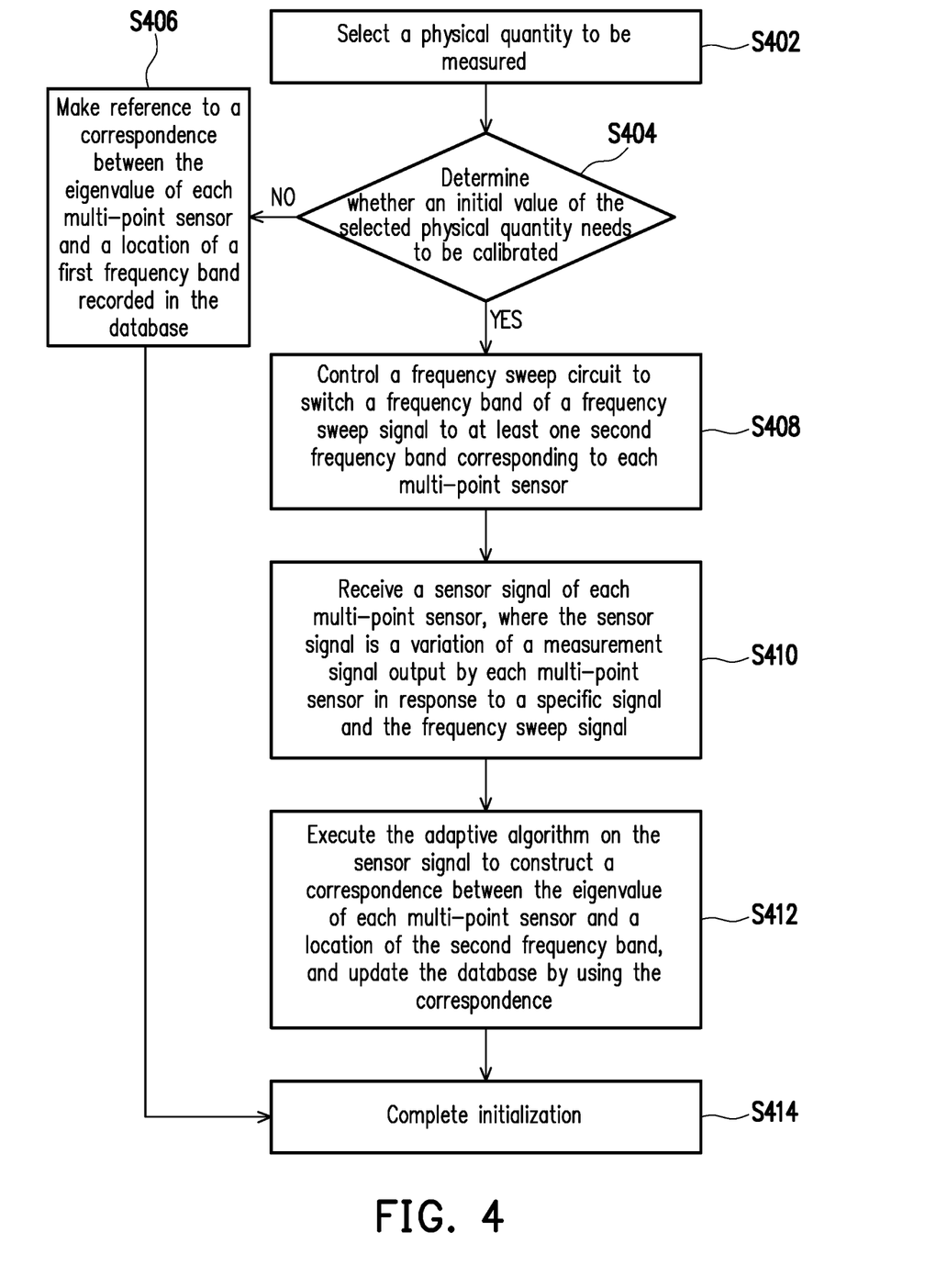
FIG. 4 is a flow diagram of a sensing signal calibration method illustrated according to one embodiment of the disclosure.

To be more specific, FIG. 4 is a flow diagram of a sensing signal calibration method illustrated according to one embodiment of the disclosure. Referring to FIG. 1, FIG. 2 and FIG. 4 at the same time, the method of the present embodiment is a calibration method for further description of the sensing system 10, following the method of FIG. 2. Steps of the sensing signal measuring method of the present embodiment are described below with reference to all the elements of the sensing system 10.

In step S402, the controller 20 selects a physical quantity to be measured. The controller 20 selects the physical quantity to be measured, for instance, when a power-on operation of a user for the sensing system 10 or a selection operation for the physical quantity is received.

In step S404, the controller 20 determines whether an initial value of the selected physical quantity needs to be calibrated. If the selected physical quantity may directly correspond to a measurement signal output by each multi-point sensor 1 (i.e., a change of a signal frequency directly corresponds to a change of the physical quantity), it may be determined that the initial value of the selected physical quantity does not need to be calibrated. Then, step S406 proceeds. Measurement of the selected physical quantity is directly set as reference made to the correspondence between the eigenvalue of each multi-point sensor 1 and the location of the first frequency band recorded in the database, so as to complete initialization (step S412).

However, if the initial value of the selected physical quantity may change as the environment changes, it may be determined that the initial value of the selected physical quantity needs to be calibrated. Then, step S408 proceeds. The controller 20 controls the frequency sweep circuit 18 to switch the frequency sweep signal to at least one second frequency band corresponding to each multi-point sensor 1. In one embodiment, a range of each second frequency band is greater than or equal to a range of each first frequency band. Compared with an environment that has more stable conditions (temperature, pressure, etc.) in a test before delivery, the actual use environment after the delivery changes a lot and has more factors that affect the measurement. Therefore, compared with a relatively narrow frequency band of the frequency sweep signal in the test before delivery, the frequency band of the frequency sweep signal in actual use after the delivery may be appropriately expanded, so as to respond to the influence of an environment change on the measurement signals (for instance, if the mechanical wave signal drifts in a relative amplitude, the frequency range of the electromagnetic wave signal will also be enlarged under the temperature influence).

In step S410, the controller 20 receives a sensor signal of each multi-point sensor 1 through the connecting device 14. The sensor signal is a variation of the measurement signal output by each multi-point sensor 1 in response to the specific signal and the frequency sweep signal, and is, for instance, calculated by the mixer 16.

In step S412, the controller 20 executes an adaptive algorithm on the sensor signal to construct a correspondence between the eigenvalue of each multi-point sensor 1 and a location of the second frequency band, and updates the database according to this correspondence. Then, in step S414, the initialization is completed.

By the above method, the sensing system 10 of the embodiment of the disclosure may adaptively calibrate the correspondence between the eigenvalues of the multi-point sensors 1 and the measurement signal locations in response to different use environments, thereby improving the accuracy of the measured physical quantity.

On the other hand, since the data construction is performed for the various multi-point sensors before delivery, the sensing system may adaptively switch the frequency band of the frequency sweep signal for the physical quantity to be measured by the user to acquire the sensor signal, and compare the sensor signal with data in the database to acquire a corresponding physical quantity sensing value.

Figure 5:
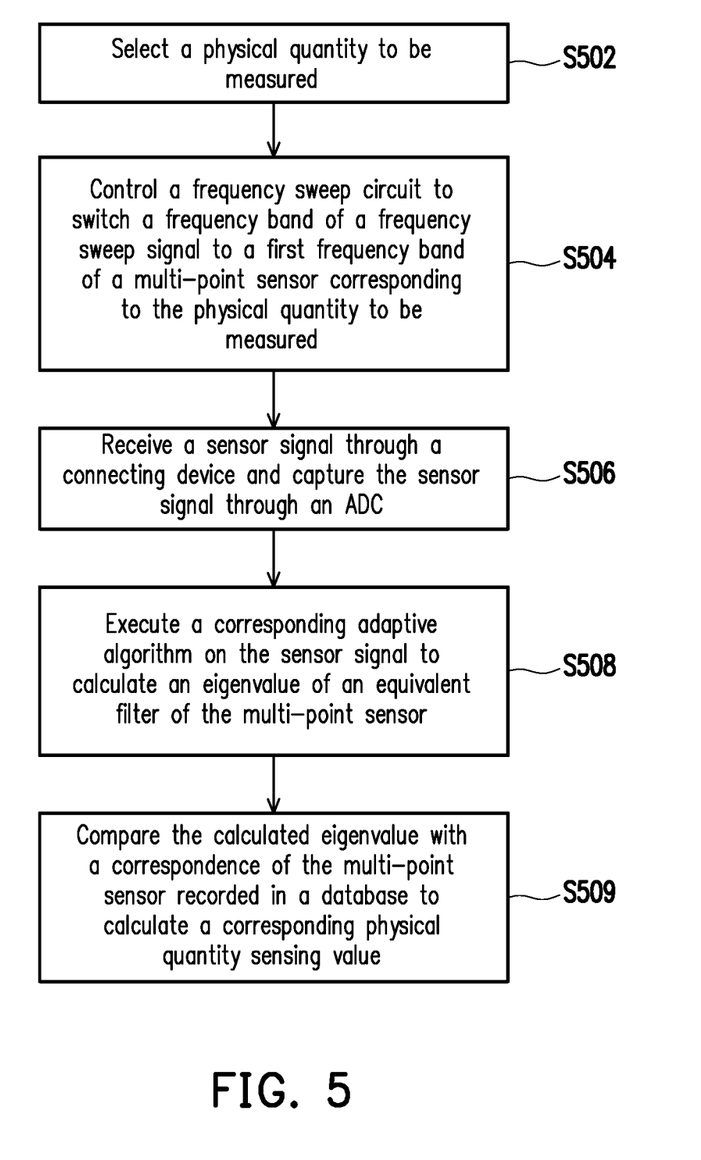
FIG. 5 is a flow diagram of a sensing signal measuring method illustrated according to one embodiment of the disclosure.

FIG. 5 is a flow diagram of a sensing signal measuring method illustrated according to one embodiment of the disclosure. Referring to FIG. 1, FIG. 2 and FIG. 5 at the same time, the method of the present embodiment is an actual measuring method for further description of the sensing system 10, following the method of FIG. 2. Detailed steps of the sensing signal measuring method of the present embodiment are described below with reference to all the elements of the sensing system 10.

In step S502, the controller 20 selects a physical quantity to be measured. The controller 20 selects the physical quantity to be measured, for instance, when a power-on operation of a user for the sensing system 10 or a selection operation for the physical quantity is received.

In step S504, the controller 20 controls the frequency sweep circuit 18 to switch the frequency sweep signal to a first frequency band of the multi-point sensor 1 corresponding to the physical quantity to be measured. The controller 20 acquires, for instance, which multi-point sensor needs to be used to measure this physical quantity by searching the database, and acquires a frequency band applicable to this multi-point sensor, so as to control the frequency sweep circuit 18 to switch the frequency sweep signal.

In step S506, the controller 20 receives a sensor signal through the connecting device 14 and captures the sensor signal through the ADC 22. The sensor signal is, for instance, a variation of a measurement signal output by the multi-point sensor 1 in response to a specific signal transmitted by the signal source 12 and the frequency sweep signal output by the frequency sweep circuit 18. The controller 20, for instance, sets a capturing frequency at which the ADC 22 captures the sensor signal as a maximum frequency band obtained by doubling a designated frequency response range of a to-be-measured object (e.g., a frequency response range of a to-be-measured physical quantity) and then performing a frequency shifting operation, so that the sensor signal is captured as a discrete digital signal. The captured discrete digital signal is taken as data with specific quantity points of at least a certain value (e.g., 10000 points), and an adaptive algorithm is executed on the data to calculate an eigenvalue.

In step S508, the controller 20 executes a corresponding adaptive algorithm on the sensor signal to calculate an eigenvalue of an equivalent filter of the multi-point sensor 1. In one embodiment, the above adaptive algorithm is, for instance, executed by the DSP 24 in the controller 20, and the above equivalent filter is, for instance, a lattice structure filter, and it is not limited here.

In step S510, the controller 20 compares the calculated eigenvalue with the correspondence of the multi-point sensor 1 recorded in the database to calculate a corresponding physical quantity sensing value.

By the above method, the sensing system 10 of the embodiment of the disclosure can adaptively adjust, according to the pre-constructed database, the frequency band of the frequency sweep signal for the physical quantity to be measured to acquire the sensor signal and calculate the eigenvalue, and can obtain the corresponding physical quantity sensing value by comparing the eigenvalue with the data in the database.

Embodiments of the disclosure provide a sensing system and a sensing signal measuring method thereof, which can reduce the influence of a process or an environment on response frequencies of sensors and are widely applied to a plurality of types of multi-point sensors.

Based on the above, according to the sensing system and the sensing signal measuring method thereof of the embodiments of the disclosure, the signal source is used to output the specific signal, and initialize the measurement signals of the different types of multi-point sensors in combination with the frequency shift operation of the frequency sweep circuit, so that the sensing system of the embodiment of the disclosure can achieve certain universality. In addition, in terms of the problem that the response frequencies of the sensors are easily affected by a process or a use environment, the embodiment of the disclosure further uses the adaptive algorithm to cooperate with an initialized frequency sweep process, so as to reduce the variation range caused by the above factors and improve the accuracy of the measured physical quantity.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A sensing signal measuring method, applicable to a sensing system comprising a signal source, a connecting device, a frequency sweep circuit, and a controller, wherein the method comprises following steps:
    activating the signal source to generate a specific signal;
    controlling, by the controller, the frequency sweep circuit to switch a frequency band of a frequency sweep signal to at least one first frequency band corresponding to each of a plurality of types of multi-point sensors;
    receiving, through the connecting device by the controller, a sensor signal of each of the plurality of types of multi-point sensors, wherein the sensor signal is a variation of a measurement signal output by each of the plurality of types of multi-point sensors in response to the specific signal and the frequency sweep signal, and the measurement signal is one of an electromagnetic wave signal and a mechanical wave signal; and
    executing, by the controller, an adaptive algorithm on the sensor signal to construct a correspondence between an eigenvalue of each of the plurality of types of multi-point sensors and a location of the at least one first frequency band, and recording the correspondence in a database.

2. The method according to claim 1, wherein the step of controlling, by the controller, the frequency sweep circuit to switch the frequency band of the frequency sweep signal to the first frequency band corresponding to each of the plurality of types of multi-point sensors comprises:
    controlling, by the controller, the frequency sweep circuit to switch the frequency band of the frequency sweep signal so as to enable a frequency range of the variation of the frequency sweep signal and the measurement signal to fall within a frequency range of an analog-to-digital converter configured to capture the sensor signal in the controller.

3. The method according to claim 2, after the step of executing, by the controller, the adaptive algorithm on the sensor signal to construct the correspondence between the eigenvalue of each of the plurality of types of multi-point sensors and the location of the at least one first frequency band, and recording the correspondence in the database, further comprising:
    controlling, by the controller, the frequency sweep circuit to switch the frequency band of the frequency sweep signal to the at least one first frequency band of each of the plurality of types of multi-point sensors corresponding to a physical quantity to be measured, and capturing the sensor signal through the analog-to-digital converter;

executing, by the controller, the corresponding adaptive algorithm on the sensor signal to calculate an eigenvalue of an equivalent filter of each of the plurality of types of multi-point sensors; and comparing the calculated eigenvalue with the correspondence of each of the plurality of types of multi-point sensors recorded in the database to calculate a corresponding physical quantity sensing value.

4. The method according to claim 1, wherein the step of executing, by the controller, the adaptive algorithm on the sensor signal to construct the correspondence between the eigenvalue of each of the plurality of types of multi-point sensors and the location of the at least one first frequency band comprises:

calculating, by the controller, the sensor signal through an equivalent filter corresponding to each of the plurality of types of multi-point sensors to solve an eigenvalue of the equivalent filter of each of the plurality of types of multi-point sensors, and constructing the correspondence according to the location of the eigenvalue in the at least one first frequency band and the corresponding eigenvalue.

5. The method according to claim 1, wherein the controller executes the adaptive algorithm through a built-in digital signal processor.

6. The method according to claim 1, after the step of executing, by the controller, the adaptive algorithm on the sensor signal to construct the correspondence between the eigenvalue of each of the plurality of types of multi-point sensors and the location of the at least one first frequency band, and recording the correspondence in the database, further comprising:

selecting a physical quantity to be measured, and determining whether an initial value of the selected physical quantity needs to be calibrated; and if the initial value needs to be calibrated, re-controlling, by the controller, the frequency sweep circuit to switch the frequency band of the frequency sweep signal to at least one second frequency band of each of the plurality of types of multi-point sensors corresponding to the physical quantity, calculating a variation of the frequency sweep signal and the measurement signal as the sensor signal, executing the adaptive algorithm on the sensor signal to construct a correspondence between the eigenvalue of each of the plurality of types of multi-point sensors and a location of the at least one second frequency band, and updating the database according to the correspondence.

7. The method according to claim 6, wherein a range of each of the at least one second frequency band is greater than or equal to a range of each of the at least one first frequency band.

8. The method according to claim 6, wherein the step of selecting the physical quantity to be measured comprises:

receiving a power-on operation of a user for the sensing system or a selection operation for the physical quantity to select the physical quantity to be measured.

9. The method according to claim 1, wherein the specific signal comprises white noise, square waves, impulses or a signal of a specific frequency.

10. The method according to claim 1, wherein the adaptive algorithm comprises a least mean square algorithm, a sign-data least mean square algorithm, a sign-sign least mean square algorithm, a normalized least mean square algorithm, a delayed least mean square algorithm, a recursive least square algorithm, a Levinson-durbin recursion algorithm, or a linear prediction coding algorithm.

11. A sensing system, comprising:

a signal source, configured to generate a specific signal;

a connecting device, coupled to a plurality of types of multi-point sensors;

a frequency sweep circuit, configured to generate a frequency sweep signal; and a controller, coupled to the connecting device and the frequency sweep circuit, and configured to control the frequency sweep circuit to switch a frequency band of the frequency sweep signal to at least one first frequency band corresponding to each of the plurality of types of multi-point sensors, and receive a sensor signal of each of the plurality of types of multi-point sensors through the connecting device, wherein the sensor signal is a variation of the frequency sweep signal and a measurement signal output by each of the plurality of types of multi-point sensors in response to the specific signal, the measurement signal is one of an electromagnetic wave signal and a mechanical wave signal, and the controller executes an adaptive algorithm on the sensor signal to construct a correspondence between an eigenvalue of each of the plurality of types of multi-point sensors and a location of the at least one first frequency band, and records the correspondence in a database.

12. The sensing system according to claim 11, wherein the controller comprises an analog-to-digital converter, and the controller controls the frequency sweep circuit to switch the frequency band of the frequency sweep signal so as to enable a frequency range of the variation of the frequency sweep signal and the measurement signal to fall within a frequency range of the analog-to-digital converter configured to capture the sensor signal.

13. The sensing system according to claim 12, wherein the controller controls the frequency sweep circuit to switch the frequency band of the frequency sweep signal to the at least one first frequency band of each of the plurality of types of multi-point sensors corresponding to a physical quantity to be measured, captures the sensor signal through the analog-to-digital converter, executes the corresponding adaptive algorithm on the sensor signal to calculate an eigenvalue of an equivalent filter of each of the plurality of types of multi-point sensors, and compares the calculated eigenvalue with the correspondence of each of the plurality of types of multi-point sensors recorded in the database to calculate a corresponding physical quantity sensing value.

14. The sensing system according to claim 11, wherein the controller calculates the sensor signal through an equivalent filter corresponding to each of the plurality of types of multi-point sensors to solve an eigenvalue of the equivalent filter of each of the plurality of types of multi-point sensors, and constructs the correspondence according to the location of the eigenvalue in the at least one first frequency band and the corresponding eigenvalue.

15. The sensing system according to claim 11, wherein the controller comprises a digital signal processor, and executes the adaptive algorithm through the digital signal processor.

16. The sensing system according to claim 11, wherein the controller selects a physical quantity to be measured, and determines whether an initial value of the selected physical quantity needs to be calibrated; if the initial value needs to be calibrated, the controller re-controls the frequency sweep circuit to switch the frequency band of the frequency sweep signal to at least one second frequency band of each of the plurality of types of multi-point sensors corresponding to the physical quantity, calculates a variation of the frequency sweep signal and the measurement signal as the sensor signal, executes the adaptive algorithm on the sensor signal to construct a correspondence between the eigenvalue of each of the plurality of types of multi-point sensors and a location of the at least one second frequency band, and updates the database according to the correspondence.

17. The sensing system according to claim 16, wherein a range of each of the at least one second frequency band is greater than or equal to a range of each of the at least one first frequency band.

18. The sensing system according to claim 16, wherein the controller receives a power-on operation of a user for the sensing system or a selection operation for the physical quantity to select the physical quantity to be measured.

19. The sensing system according to claim 16, wherein the specific signal comprises white noise, square waves, impulses or a signal of a specific frequency.

20. The sensing system according to claim 16, wherein the adaptive algorithm comprises a least mean square algorithm, a sign-data least mean square algorithm, a sign-sign least mean square algorithm, a normalized least mean square algorithm, a delayed least mean square algorithm, a recursive least square algorithm, a Levinson-durbin recursion algorithm, or a linear prediction coding algorithm.

* * * * *